(12) United States Patent
Kwon

(10) Patent No.: US 9,171,622 B2
(45) Date of Patent: Oct. 27, 2015

(54) NON-VOLATILE MEMORY DEVICE AND METHOD OF FABRICATING THE SAME

(71) Applicant: SK hynix Inc., Gyeonggi-do (KR)

(72) Inventor: Young-Jun Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 158 days.

(21) Appl. No.: 13/843,846

(22) Filed: Mar. 15, 2013

(65) Prior Publication Data
US 2014/0177336 A1    Jun. 26, 2014

(30) Foreign Application Priority Data
Dec. 21, 2012   (KR) .................. 10-2012-0151081

(51) Int. Cl.
| | |
|---|---|
| G11C 16/00 | (2006.01) |
| G11C 16/04 | (2006.01) |
| G11C 16/34 | (2006.01) |
| H01L 29/423 | (2006.01) |
| H01L 29/66 | (2006.01) |
| H01L 29/788 | (2006.01) |

(52) U.S. Cl.
CPC ........ *G11C 16/0441* (2013.01); *G11C 16/3477* (2013.01); *H01L 29/42324* (2013.01); *H01L 29/66825* (2013.01); *H01L 29/7887* (2013.01)

(58) Field of Classification Search
CPC ....................................................... G11C 16/00
USPC ..................................................... 365/185.01
See application file for complete search history.

(56) References Cited

U.S. PATENT DOCUMENTS

| | | | |
|---|---|---|---|
| 2002/0145915 A1* | 10/2002 | Ogura et al. ............. | 365/185.28 |
| 2005/0232007 A1* | 10/2005 | Hsieh ......................... | 365/185.3 |
| 2009/0309153 A1 | 12/2009 | Yanagi et al. | |
| 2011/0095348 A1 | 4/2011 | Chakihara et al. | |
| 2012/0287716 A1* | 11/2012 | Li et al. .................... | 365/185.17 |

FOREIGN PATENT DOCUMENTS

KR    1020100080244    7/2010

* cited by examiner

*Primary Examiner* — Min Huang
(74) *Attorney, Agent, or Firm* — IP & T GROUP LLP

(57) ABSTRACT

This technology provides a non-volatile memory device and a method of manufacturing the same, which may prevent an over-erase phenomenon and also increase the degree of integration, In an aspect, the non-volatile memory device includes a select gate formed over a substrate, a plurality of floating gates laterally formed with respect to the select gate and spaced apart from each other, to be independently programmable, and a plurality of junctions formed in the substrate and arranged to be controllable by the respective floating gates.

18 Claims, 12 Drawing Sheets

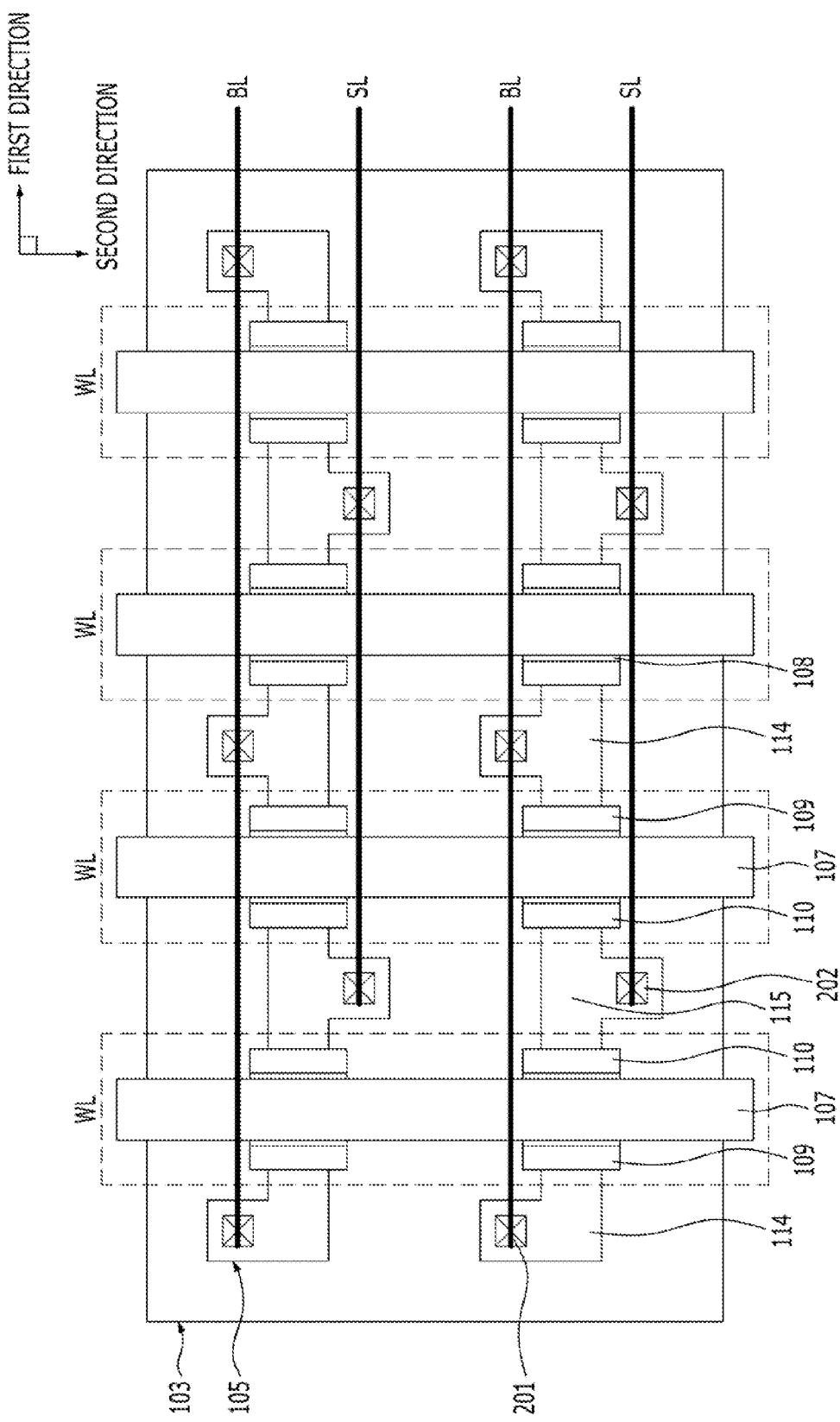

NON-VOLATILE MEMORY DEVICE AND METHOD OF FABRICATING THE SAME

CROSS-REFERENCE TO RELATED APPLICATIONS

The present application claims priority of Korean Patent Application Nos. 10-2012-0151081, filed on Dec. 21, 2012, which is incorporated herein by reference in their entireties.

BACKGROUND

1. Field

Exemplary embodiments of the present invention relate to semiconductor device manufacture technology, and more particularly, to a non-volatile memory device and a method of manufacturing the same.

2. Description of the Related Art

A life environment changes into a life environment in which anyone may easily use desired information at anytime and anywhere thanks to the recent digital media devices. A variety of rapidly spreading devices using a digital method require storage media that may store captured images, recorded music, and various data conveniently. In line with this trend, there is a growing interest in a system on chip (SoC) field according to a tendency for the degree of integration of non-memory semiconductors to increase, and worldwide semiconductor companies are in competition with each other in order to enhance SoC chip-based technology.

A SoC chip means that system technologies are integrated into one semiconductor. If system design technology is not secured, the development of a non-memory semiconductor will become difficult. One of the essential SoC chip fields in which complicated technologies are integrated as described above is an embedded memory chip, and an embedded flash memory chip has been in the spotlight from among the embedded memory chips.

However, the known embedded flash memory is problematic in that an over-erase phenomenon may be generated when an erase operation is performed. In order to solve the concern, an additional operation, such as recovery, is necessary. However, in this case, there may be another concern in that the size of a peripheral circuit is increased.

In contrast, there has been introduced a technology in which a select gate is disposed in each cell in order to prevent the over-erase phenomenon without an additional operation, such as recovery, and a peripheral circuit for the recovery operation. However, there may be another concern in that the size of a unit cell is doubled or more than being doubled due to the inclusion of the select gate.

SUMMARY

Exemplary embodiments of the present invention are directed to providing a non-volatile memory device and a method of manufacturing the same, which may prevent an over-erase phenomenon and also increase the degree of integration.

In accordance with an embodiment of the present invention, a non-volatile memory device may include a select gate formed over a substrate, a plurality of floating gates laterally formed with respect to the select gate and spaced apart from each other, to be independently programmable, and a plurality of junctions formed in the substrate and arranged to be controllable by the respective floating gates.

In accordance with an embodiment of the present invention, a non-volatile memory device may include a select gate formed over a substrate, a plurality of floating gates formed on the sidewalls of the select gate and spaced apart from each other so that the floating gates are independently programmable, and a plurality of junctions formed in the substrate and formed to be adjacent to the respective floating gates.

In accordance with another embodiment of the present invention, a non-volatile memory device may include a select gate formed over a substrate, a first floating gate formed on one of sidewalls of the select gate, a second floating gate formed on the other of the sidewalls of the select gate, a first junction formed in the substrate under the first floating gate, and a second junction formed in the substrate under the second floating gate, wherein the first floating gate and the second floating gate are independently programmable.

In accordance with still another embodiment of the present invention, a non-volatile memory device may include a substrate including a plurality of active regions, a plurality of word lines crossing the active regions, a plurality of junctions formed in the active region between the word lines, and a bit line and a source line connected to the respective junctions on one side and the other side of any one of the word lines, wherein the word line includes a select gate crossing the active region and a plurality of floating gates formed on the sidewalls of the select gate in such a way as to overlap with the active region and spaced apart from each other in such a way as to be independently programmed.

The plurality of floating gates may be erased through the use of a Fowler-Nordheim (FN) tunneling method.

A floating gate adjacent to any one of the plurality of junctions may be performed through the use of a hot carrier injection (HCI) method.

The first floating gate and the second floating gate may be erased through the use of a Fowler-Nordhelm (FN) tunneling method.

The first and second floating gates may be programmed through the use of a hot carrier injection (HCI) method.

In accordance with still another embodiment of the present invention, a method of manufacturing a non-volatile memory device comprises forming a select gate over a substrate, forming pre-floating gates on sidewalls of the select gate, simultaneously forming a first floating gate on one of the sidewalls of the select gate and a second floating gate on the other of the sidewalls of the select gate by selectively etching the pre-floating gates, and forming junctions in the substrate under the first floating gate and the second floating gate.

The method of manufacturing a non-volatile memory device may further comprise forming a charge block layer on a surface of a structure including the select gate before forming the pre-floating gates, and performing a blanket-etch process on the charge block layer.

The forming of pre-floating gates on sidewalls of the select gate may include forming a gate conductive layer on a surface of a structure including the select gate, and performing a blanket-etch process on the gate conductive layer.

The blanket-etch process may include an etch-back process.

The forming of the first floating gate and the second floating gate may include forming a mask pattern over a structure including the pre-floating gates, and etching the pre-floating gates by using the mask pattern.

The first floating gate and the second floating gate may have a spacer type.

BRIEF DESCRIPTION OF THE DRAWINGS

FIGS. 4A and 4B are plan views of a cell array of a non-volatile memory device in accordance with one embodiment of the present invention.

DETAILED DESCRIPTION

Figure 1A:
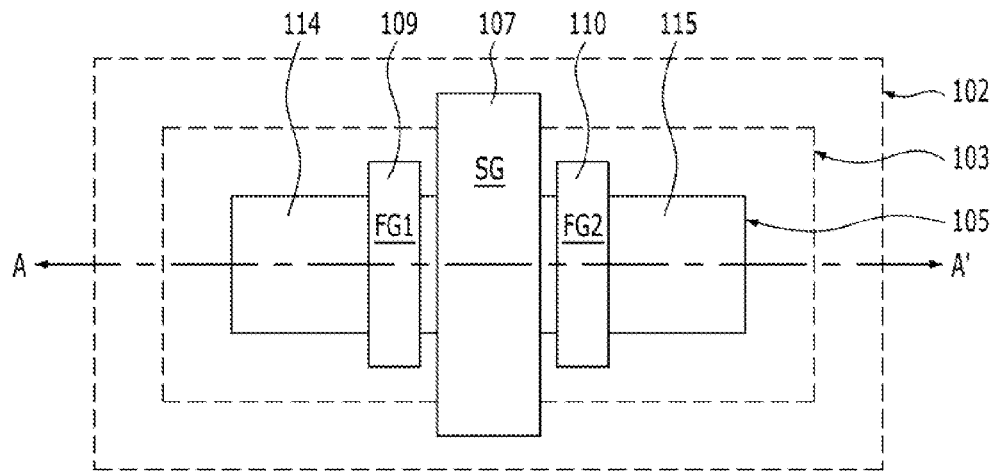
FIGS. 1A and 1B illustrate non-volatile memory devices in accordance with one embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The present invention provides a non-volatile memory device easily applicable to embedded memory and a method of manufacturing the same. More particularly, embodiments of the present invention relate to an embedded flash memory that has been in the spotlight even in the embedded memory, and provide a non-volatile memory device and a method of manufacturing the same, which may prevent an over-erase phenomenon and also increase the degree of integration. To this end, in accordance with the embodiments of the present invention, a non-volatile memory device including a select gate that may prevent an over-erase phenomenon without an additional operation, such as recovery, and a peripheral circuit for the recovery operation and may compensate for or offset an increase in the size (or area) of a unit cell due to the inclusion of the select gate, and a method of manufacturing the same are provided.

Meanwhile, in the following description, a first conduction type and a second conduction type refer to complementary conduction types. That is, if the first conduction type is a P type, the second conduction type is an N type, and if the first conduction type is an N type, the second conduction type is a P type. This means that a non-volatile memory device in accordance with one embodiment of the present invention may have an N-channel type or a P-channel type. It is hereinafter assumed that a first conduction type is a P type and a second conduction type is an N type, for convenience of description. That is, a non-volatile memory device having an N-channel type is described as an example.

Figure 1B:
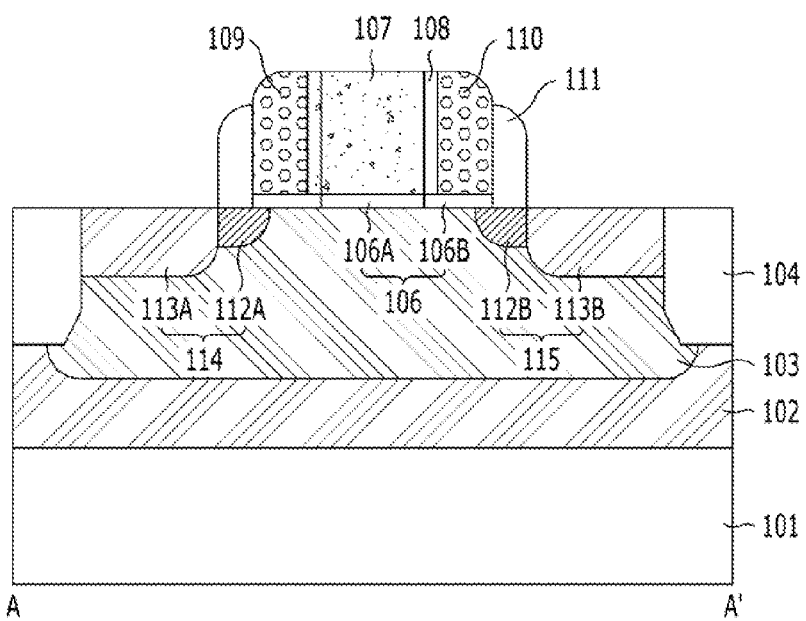

FIGS. 1A and 1B illustrate non-volatile memory devices in accordance with one embodiment of the present invention. More particularly, FIGS. 1A and 1B show one cell of a non-volatile memory device, FIG. 1A is a plan view of the cell, and FIG. 1B is a cross-sectional view of the cell taken along line A-A' of FIG. 1A.

As shown in FIGS. 1A and 1B, a second well 102 having a second conduction type is formed in a substrate 101, and a first well 103 having a first conduction type is formed in the second well 102. The substrate 101 may be a semiconductor substrate. The semiconductor substrate may have a single crystal state and include a silicon-containing material. That is, the semiconductor substrate may include a single crystal silicon-containing material. For example, the substrate 101 may be a bulk silicon substrate, a support substrate, or a silicon on insulator (SOI) substrate in which a buried insulating layer and a single crystal silicon layer are sequentially stacked. The second well 102 and first well 103 formed in the substrate 101 may bean impurity region formed by implanting the ions of impurities having the second conduction type and an impurity region formed by implanting the ions of impurities having the first conduction type, respectively. Each of the second well 102 and first well 103 provides a base that may operate as a unit cell. Here, the forming of the first well 103 and the second well 102 may be determined based on an erase operation of a unit cell. More specifically, in case that an FN tunneling method is used during the erase operation, both of the first well 103 and the second well 102 may be formed. In case that bend to bend tunneling (BTBT) method is used during the erase operation, the first well 103 may be formed. If the first well 103 and the second well 102 are formed, the second well 102 may be a deep well, and the first well 103 may be an isolated well. The deep well may include the plurality of isolated wells. The plurality of isolated wells may be separated from the deep well by way of junction isolation. When the non-volatile memory device operates, a bias (e.g., voltage) may be supplied to the second well 102 and first well 103. The detailed descriptions of the forming of the first well 103 and the second well 102 will be following later with reference to FIGS. 4A, 4B, 5A and 5B.

Isolation layers 104 that define active regions 105 are formed in the substrate 101. The active region 105 may have a bar type or a line type, either having a long axis and a short axis. Furthermore, the active region 105 may further include protruding parts (not shown) formed at the ends of the active region 105 in the direction of the long axis. The isolation layers 104 could have been formed by a shallow trench isolation (STI) process. The isolation layer 104 may include an insulating layer. The bottom of the isolation layer 104 may be higher than the bottom of the first well 103 on the basis of a surfaced of the substrate 101. In some embodiments, the bottom of the isolation layer 104 may be placed between the bottom of the first well 103 and the bottom of the second well 102.

A select gate SG 107 for preventing an over-erase phenomenon and also functioning as a control gate is formed over the substrate 101. The select gate 107 may be placed at the central part of the active region 105, and both ends of the active region 105 in the direction of the short axis may have a bar type in which they are extended upwardly from the isolation layer 104. The select gate 107 may include a silicon-containing material or a metal-containing material.

A first floating gate FG1 109 is formed on one of the sidewalls of the select gate 107, and a second floating gate FG2 110 is formed on the other of the sidewalls of the select gate 107. For example, the first and second floating gates FG1 109 and FG2 110 are laterally formed with respect to the select gate 107. The first floating gate 109 and the second floating gate 110 may be placed in the active region 105 on both sidewalls of the select gate 107. When being seen on the plane, the first floating gate 109 and the second floating gate 110 may have a bar type in which both ends of the active region 105 in the direction of the short axis are extended upwardly from the isolation layer 104. When being seen in the cross section, the first floating gate 109 and the second floating gate 110 may have a spacer type. Each of the first floating gate 109 and the second floating gate 110 may include a silicon-containing material. For example, each of the first floating gate 109 and the second floating gate 110 may include a polysilicon layer.

The first floating gate 109 and the second floating gate 110 are coupled at the same time in response to a bias supplied to the select gate 107, but may operate independently. That is, the first floating gate 109 and the second floating gate 110 may be programmed independently. Accordingly, a unit cell, including the select gate 107, the first floating gate 109, and the second floating gate 110, is a multi-bit cell that may store one or more pieces of logic information and offset an increase in the size (or area) of a unit cell according to the select gate 107 by storing one or more pieces of logic information.

Charge block layers 108 are formed between the first floating gate 109 and the select gate 107 and between the second floating gate 110 and the select gate 107. More particularly, when being seen on the plane, the charge block layers 108 may have a type in which they are formed on the sidewalls of the select gate 107 in such a way as to surround the select gate 107 or may be formed only between the select gate 107 and the first floating gate 109 and between the select gate 107 and the second floating gate 110, respectively. When being seen in the cross section, the charge block layers 108 may have a type in which they are formed between sidewalls where the select gate 107 and the first floating gate 109 face each other and between sidewalls where the select gate 107 and the second floating gate 110 face each other. The charge block layer 108 may include an insulating layer. For example, the charge block layer 108 may include any one layer selected from the group consisting of an oxide layer, a nitride layer, and an oxide nitride layer, or a stack layer thereof. Here, the material and stack type of the charge block layer 108 may be determined by taking coupling ratios between the select gate 107 and the first floating gate 109 and between the select gate 107 and the second floating gate 110 into consideration. For example, the charge block layer 108 may be an oxide-nitride-oxide (ONO) layer.

Spacers 111 are formed on the sidewalls of the gate structure, including the select gate 107, the first floating gate 109, the second floating gate 110, and the charge block layer 108. Each of the spacers 111 may be any one layer selected from the group consisting of an oxide layer, a nitride layer, and an oxide nitride layer, or a stack layer thereof.

A gate insulating layer 106 is formed between a structure including the select gate 107, the first floating gate 109 and the second floating gate 110, and the substrate 101. The gate insulating layer 106 may be any one layer selected from the group consisting of an oxide layer, a nitride layer, and an oxide nitride layer, or a stack layer thereof. More particularly, a first gate insulating layer 106A is formed between the select gate 107 and the substrate 101, and second gate insulating layers 106B are formed between the first floating gate 109 and the substrate 101 and between the second floating gate 110 and the substrate 101. The first gate insulating layer 106A and the second gate insulating layer 106B may be made of the same material or different materials. Furthermore, the first gate insulating layer 106A and the second gate insulating layer 106B may have the same thickness or different thicknesses. That is, the material, thickness, and stack type of the gate insulating layer 106 may be determined depending on the characteristics of each gate.

A first junction 114 having the second conduction type is formed in the substrate 101 under the first floating gate 109. The first junction 114 may be controlled by the first floating gate 109. A second junction 115 having the second conduction type is formed in the substrate 101 under the second floating gate 110. The second junction 115 may be controlled by the first floating gate 110. The first junction 114 and the second junction 115 may be formed at both ends of the active region 105 and may be formed in the first well 103. The first junction 114 and the second junction 115 may be impurity regions formed by implanting impurities having the second conduction type into the substrate 101 and may have an LDD structure. More particularly, the first Junction 114 may include a first impurity region 112A and a second impurity region 113A both having the second conductive type, and the second junction 115 may include another first impurity region 112B and another second impurity region 113B both having the second conductive type. The impurity doping concentration of the second impurity regions 113A and 113B may be higher than the impurity doping concentration of the first impurity regions 112A and 112B, respectively. Furthermore, a part of the first impurity region 112A may overlap with the first floating gate 109, and a part of the first impurity region 112B may overlap with the second floating gate 110. A boundary where the first impurity region 112A adjoins to the second impurity region 113A may be aligned with the sidewall of the spacer 111, and a boundary where the first impurity region 112B adjoins to the second impurity region 113B may be aligned with the sidewall of another spacer 111.

The non-volatile memory device having the aforementioned structure may prevent an over-erase phenomenon because it includes the select gate 107. Accordingly, for example, an additional operation, such as recovery, is not necessary, and a peripheral circuit for the recovery operation is not necessary. That is, by preventing the over-erase phenomenon, the operating characteristics and the degree of integration of the non-volatile memory devices may be improved.

Furthermore, since the first floating gate 109 and the second floating gate 110 may be programmed independently, an increase in the area of a unit cell due to the inclusion of the select gate 107 may be offset.

Furthermore, for example, an additional element for coupling the first floating gate 109 and the second floating gate 110 is not necessary because the first floating gate 109 and the second floating gate 110 are coupled by the select gate 107. Accordingly, the degree of integration may be improved.

An example in which the first floating gate FG1 109 and the second floating gate FG2 110 sharing the select gate 107 may be programmed independently is described below with reference to Table 1 showing an example of the operating conditions of the unit cell of the non-volatile memory device in accordance with one embodiment of the present invention.

TABLE 1

| OPERATION | PROGRAM | | ERASE | | READ | |
|---|---|---|---|---|---|---|
| METHOD | HCI | | FN TUNNELING | BTBT | FORWARD | |
| ELEMENT | $1^{ST}$ FG | $2^{ND}$ FG | $1^{ST}$ AND $2^{ND}$ FGs | $1^{ST}$ OR $2^{ND}$ FGs | $1^{ST}$ FG | $2^{ND}$ FG |

TABLE 1-continued

| OPERATION | PROGRAM | | ERASE | | READ | |
|---|---|---|---|---|---|---|
| SELECT GATE | VPP | | GND | −VPP | VCC | |
| FIRST JUNCTION | VPP | GND | FLOATING | VPP OR FLOATING | Vread | GND |
| SECOND JUNCTION | GND | VPP | FLOATING | FLOATING OR VPP | GND | Vread |
| FIRST WELL | GND | | VPP | GND | GND | |
| SECOND WELL | GND | | VPP | — | GND | |

First, a program operation may be performed in accordance with a hot carrier injection (HCI) method. The program operation may be performed by supplying a program voltage to a junction adjacent to a floating gate to be programmed in the state in which the first floating gate 109 and the second floating gate 110 are coupled by supplying a first selection voltage to the select gate 107. More particularly, if the first floating gate 109 is sought to be programmed, the program voltage may be supplied to the first junction 114, and if the second floating gate 110 is sought to be programmed, the program voltage may be supplied to the second junction 115. Here, each of the first selection voltage and the program voltage may be a positive voltage. For example, each of the first selection voltage and the program voltage may be a pumping voltage VPP. For reference, the pumping voltage VPP refers to voltage boosted from an external power source voltage VCC.

When the pumping voltage VPP is supplied to the select gate 107, a channel is formed in the substrate 101 under the select gate 107 and at the same time, a channel is also formed in the substrate 101 under the first floating gate 109 and the second floating gate 110 coupled by the select gate 107. If the first floating gate 109 is sought to be programmed, the pumping voltage VPP is supplied to the first junction 114, and the channel under the first floating gate 109 is pinched off by the pumping voltage VPP supplied to the first junction 114. At this time, the channel under the second floating gate 110 is not pinched off because the ground voltage GND is supplied to the second junction 115. Hot electrons generated from the pinch-off region under the first floating gate 109 are injected into the first floating gate 109, thereby raising the threshold voltage of the first floating gate 109. As a result, the first floating gate 109 may be programmed.

The aforementioned program method is advantageous in that a program is easy even when a coupling ratio between a floating gate and the select gate 107 is small as compared with a Fowler-Nordheim (FN) tunneling method.

Furthermore, an erase operation may be performed in accordance with the FN tunneling method or a BTBT method. In case that the FN tunneling method is used during the erase operation, the first floating gate 109 and the second floating gate 110 may be erased at the same time by supplying an erase voltage to the first well 103 and/or the second well 102 in the state in which the ground voltage GND has been supplied to the select gate 107 and both the first junction 114 and the second junction 115 have been floated. Here, the erase voltage may be a positive voltage or a negative voltage. For example, the erase voltage may be a pumping voltage VPP or a minus pumping voltage −VPP. When the pumping voltage VPP is supplied to the first well 103 and the second well 102 in the state in which the ground voltage GND has been supplied to the select gate 107 and both the first junction 114 and the second junction 115 have been floated, electric charges (e.g., electrons) injected into the first floating gate 109 and the second floating gate 110 exit from the first well 103 and the second well 102. As a result, a unit cell may be erased because the threshold voltages of the first floating gate 109 and the second floating gate 110 are decreased.

In case that the BTBT method is used during the erase operation, the first floating gate 109 or the second floating gate 110 may be selectively erased by supplying a ground voltage to the first well 103, supplying a first erase voltage to the select gate 107, and supplying or floating a second erase voltage to the first junction 114 and the second junction 115. For example, if the first floating gate 109 is requested to be erased, the second erase voltage is supplied to the first junction 114, and the second junction is floated. Herein, the first erase voltage may be a negative voltage, and the second erase voltage may be a positive voltage. For example, the first erase voltage may be a negative pumping voltage −VPP, and the second erase voltage may be a positive pumping voltage VPP.

Meanwhile, the first floating gate 109 and the second floating gate 110 may be erased at the same time by supplying the second erase voltage to the first junction 114 and the second junction 115 in the state in which the ground voltage GND has been supplied to the first gate 103 and the first erase voltage has been supplied to the select gate 107.

Furthermore, a read operation may be performed in accordance with a forward read method in which a read operation is performed by means of the movement of charges in the same direction as the direction in which charges are moved when a program operation is performed. For reference, the forward read method is advantageous in terms of the degree of integration and the degree of difficulty in the process because a cell array having a simple structure may be implemented, as compared with a reverse read method in which a read operation is performed by means of the movement of charges in an opposite direction to the direction in which charges are moved when a program operation is performed.

The read operation may be performed by sensing a shift in the threshold voltage of a unit cell. A shift in the threshold voltage of each floating gate may be sensed, or a shift in the threshold voltages of floating gates within a unit cell may be sensed at the same time. For example, the read operation may be performed by supplying a read voltage Vread to the first junction 114 or the second junction 115 in the state in which the first floating gate 109 and the second floating gate 110 have been floated by supplying a second selection voltage to the select gate 107. Here, each of the second selection voltage and the read voltage Vread may be a positive voltage. For example, the second selection voltage may be voltage between the threshold voltage of a programmed cell and the threshold voltage of an erased cell, for example, a power source voltage VCC, and the read voltage Vread may be higher than the ground voltage GND, but lower than the power source voltage VCC.

The non-volatile memory device in accordance with one embodiment of the present invention may provide a multi-bit cell because the first floating gate 109 and the second floating gate 110 formed on the sidewalls of the select gate 107 may be programmed independently as described above. Accordingly, an increase in the size of a unit cell due to the inclusion of the select gate 107 for preventing an over-erase phenomenon may be offset.

FIGS. 2A to 2F and 3A to 3F are diagrams showing an example of a method of manufacturing a non-volatile memory device in accordance with one embodiment of the present invention. More particularly, FIGS. 2A to 2F are plan view of the non-volatile memory device, and FIGS. 3A to 3F are cross-sectional views of the non-volatile memory device taken along line A-A' of FIGS. 2A to 2F.

Figure 2A:
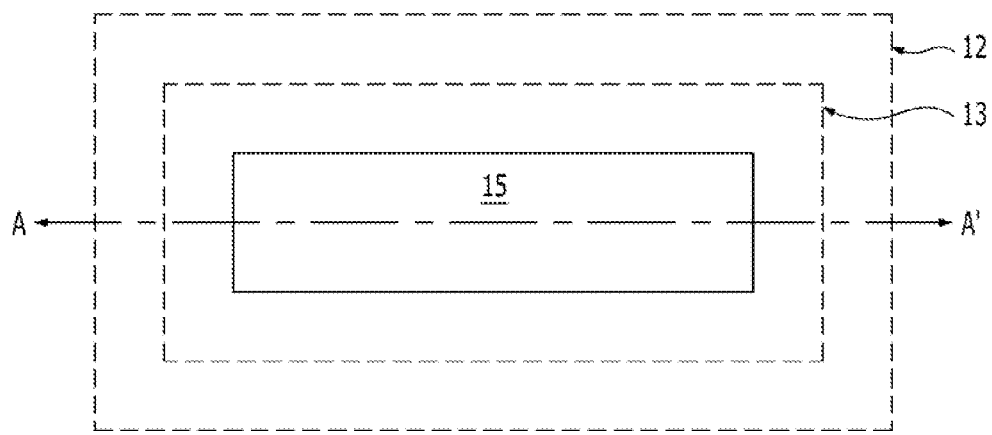
FIGS. 2A to 2F and 3A to 3F are diagrams showing an example of a method of manufacturing a non-volatile memory device in accordance with one embodiment of the present invention.
Figure 3A:
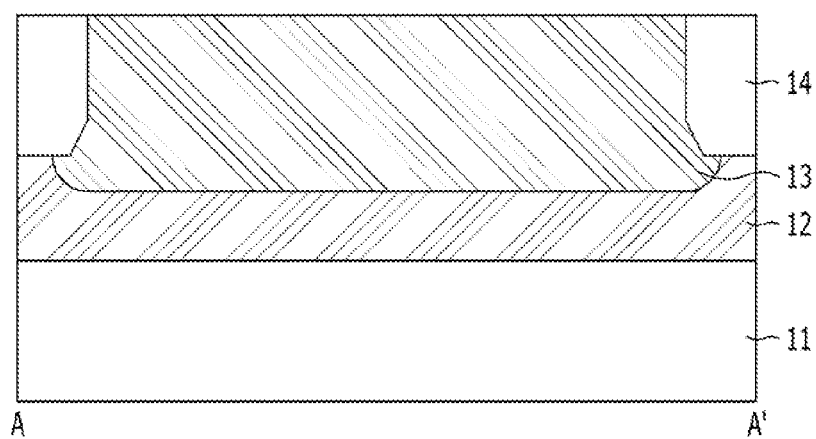

As shown in FIGS. 2A and 3A, a second well 12 having the second conductive type is formed in a substrate 11. A bulk silicon substrate or a SOI substrate may be used as the substrate 11. The second well 12 may be formed by implanting the ions of impurities (e.g., N type impurities) having the second conductive type into the substrate 11.

A plurality of active regions 15 is defined by forming isolation layers 14 in the substrate 11. The isolation layer 14 may be formed by an STI process. The STI process refers to a series of processes of forming trenches for isolation in the substrate 11 and forming isolation structures by filling the respective trenches with an insulating material. The active region 15 defined by the isolation layer 14 may have a bar type or a line type, either having a long axis and a short axis. Furthermore, the active region 15 defined by the isolation layer 14 may further include protruding parts (not shown) formed at the ends of the active region.

Next, a first well 13 having a first conductive type is formed in the substrate 11. The first well 13 may be formed in the second well 12. Here, the bottom of the first well 13 may be placed between the bottom of the isolation layer 14 and the bottom of the second well 12. A plurality of the first wells 13 may be formed in the second well 12, and the first wells 13 may be separated from each other by the isolation layer 14 and junction isolation between the first well 13 and the second well 12. The first well 13 may be formed by implanting the ions of impurities (e.g., P type impurities) having the first conductive type into the second well 12.

Figure 2B:
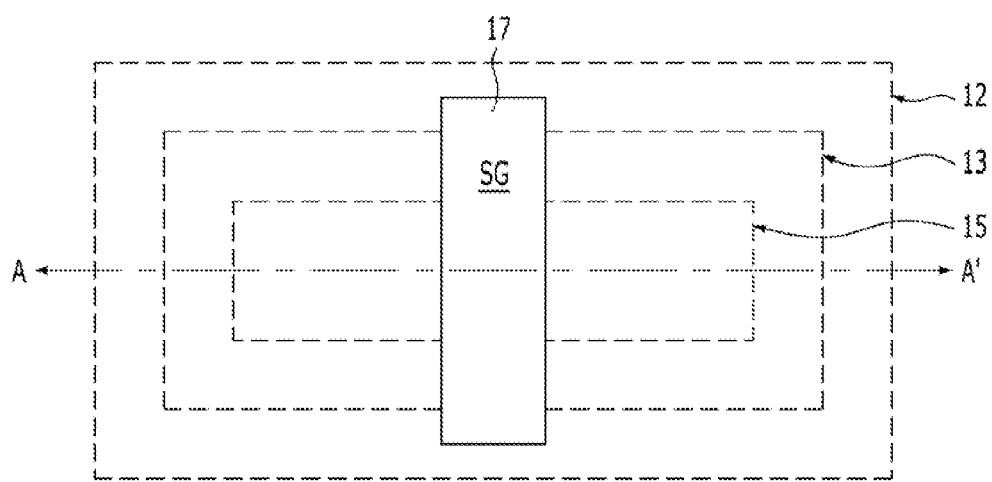
Figure 3B:
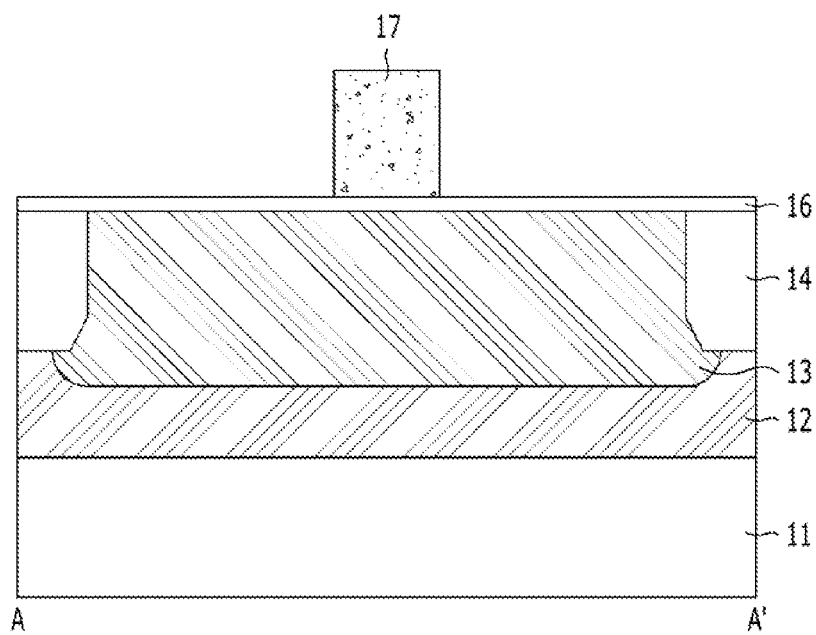

As shown in FIGS. 2B and 3B, a gate insulating layer 16 is formed over the substrate 11. The gate insulating layer 16 may be formed of any one layer selected from the group consisting of an oxide layer, a nitride layer, and an oxide nitride layer, or a stack layer thereof. For example, the gate insulating layer 16 may be formed of an oxide layer, and the oxide layer may be formed by an oxidization process including thermal oxidation, a chemical vapor deposition (CVD) method, and a deposition method including an atomic layer deposition (ALD).

A select gate SG 17 is formed on the gate insulating layer 16. The select gate 17 may be formed by a series of processes of forming a gate conductive layer (not shown) and a mask pattern (not shown) over the gate insulating layer 16 and etching the gate conductive layer by using a mask pattern as an etch barrier. Here, the gate conductive layer may include a silicon-containing material or a metal-containing material.

Meanwhile, in the process of forming the select gate 17, the gate insulating layer 16 has been illustrated as remaining without being etched, but the gate insulating layer 16 may be fully etched. If the gate insulating layer 16 is fully etched, a process of forming a gate insulating layer or a tunnel insulating layer may be further performed before forming a floating gate in a subsequent process.

Figure 2C:
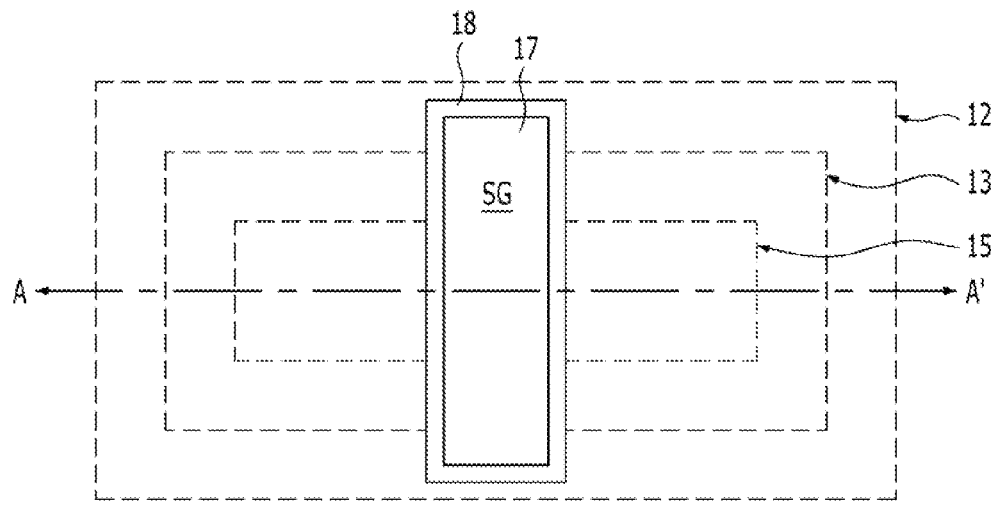
Figure 3C:
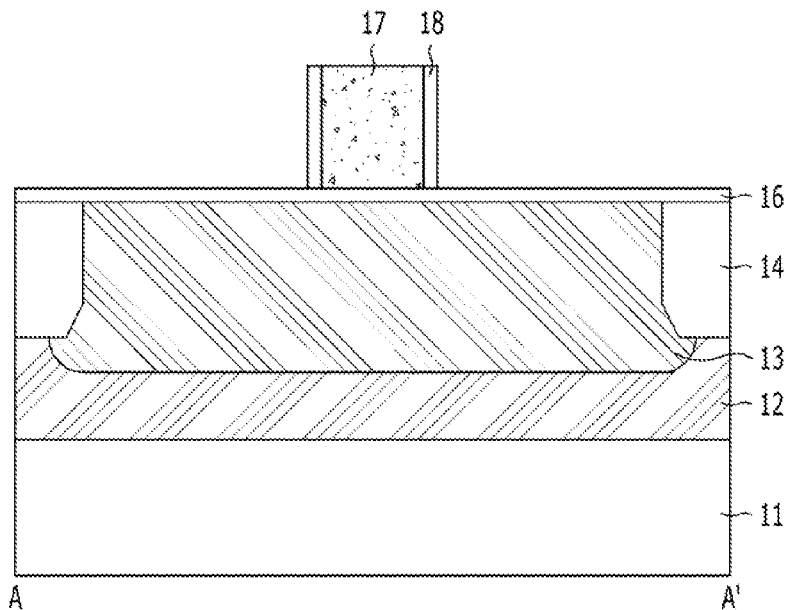

As shown in FIGS. 2C and 3C, charge block layers 18 are formed on the sidewalls of the select gate 17. When being seen on the plane, the charge block layers 18 may have a type in which they are formed on the sidewalls of the select gate 17 in such a way as to surround the select gate 17. Furthermore, when being seen in the cross section, the charge block layers 18 may have a type in which they are formed on both sidewalls of the select gate 17 and may have a spacer type.

The charge block layer 18 may include an insulating layer and functions as an isolation layer for electrically isolating the select gate 17 from a floating gate to be formed in a subsequent process. The charge block layer 18 may be formed of any one layer selected from the group consisting of an oxide layer, a nitride layer, and an oxide nitride layer, or a stack layer thereof. For example, the charge block layer 18 may be formed of an oxide-nitride-oxide (ONO) layer.

The charge block layer 18 may be formed by a series of processes of forming an insulating layer having a specific thickness on a surface of a structure including the select gate 17 and then performing a blanket-etch process, for example, an etch-back process so that the insulating layer remains on the sidewalls of the select gate 17.

Meanwhile, in the process of forming the charge block layers 18 on the sidewalls of the select gate 17, the gate insulating layer 16 has been illustrated as remaining without being etched. However, in one embodiment, since the gate insulating layer 16 already formed is for the select gate 17, the gate insulating layer 16 remaining after forming the charge block layers 18 may be removed, and a process of forming a gate insulating layer or a tunnel insulating layer having characteristics that are required by a floating gate to be formed in a subsequent process may be performed. In another embodiment, the gate insulating layer 16 already formed may not be removed after forming the charge block layers 18, and curing or re-oxidation may be performed on the gate insulating layer 16.

Figure 2D:
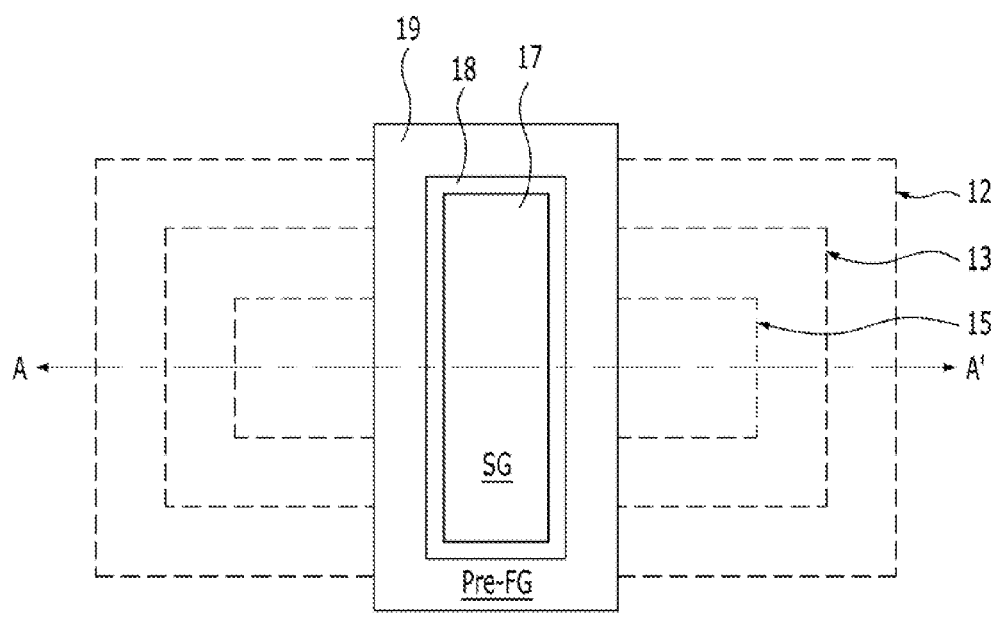
Figure 3D:
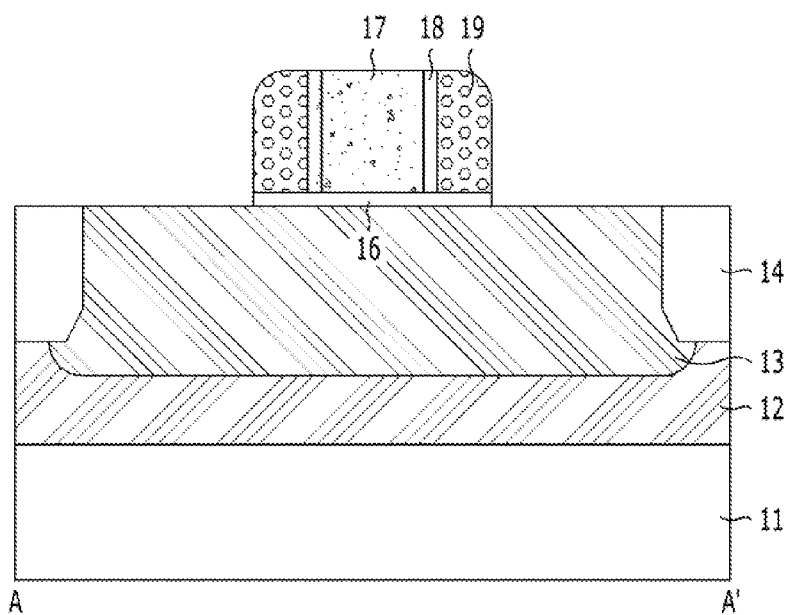

As shown in FIGS. 2D and 3D, pre-floating gates 19 are formed on the sidewalls of the select gate 17 including the charge block layers 18. When being seen on the plane, the pre-floating gates 19 may have a type in which they are formed on the sidewalls of the select gate 17 including the charge block layers 18 and surround the select gate 17. Furthermore, when being seen in the cross section, the pre-floating gates 19 may have a type in which they are formed on both sidewalls of the select gate 17 including the charge block layers 18 and may have a spacer type.

The pre-floating gates 19 may include a silicon-containing material, and the silicon-containing material may include a silicon layer. For example, the pre-floating gates 19 may be formed of a polysilicon layer.

The pre-floating gates 19 may be formed by a series of processes of depositing a gate conductive layer (e.g., a polysilicon layer) over the entire surface of the substrate 11 including the charge block layers 18 and the select gate 17 and then performing a blanket-etch process, for example, an etch-back process so that the gate conductive layer remains on the sidewalls of the select gate 17 including the charge block layers 18. Here, the gate conductive layer may be formed to have a specific thickness on a surface of the structure, and the volume and channel length of the pre-floating gate 19 may be determined depending on the thickness of the gate conductive layer. For reference, in some embodiments, the volume and channel length of the pre-floating gate 19 are factors that greatly affect operating characteristics and may be easily controlled by a simple method of controlling a deposition thickness.

Next, the substrate 11 is exposed by etching the gate insulating layer 16 by using the select gate 17, the charge block layers 18, and the pre-floating gates 19 as an etch barrier. In one embodiment, in the etch process for forming the pre-floating gates 19, the gate insulating layer 16 may be etched.

Figure 2E:
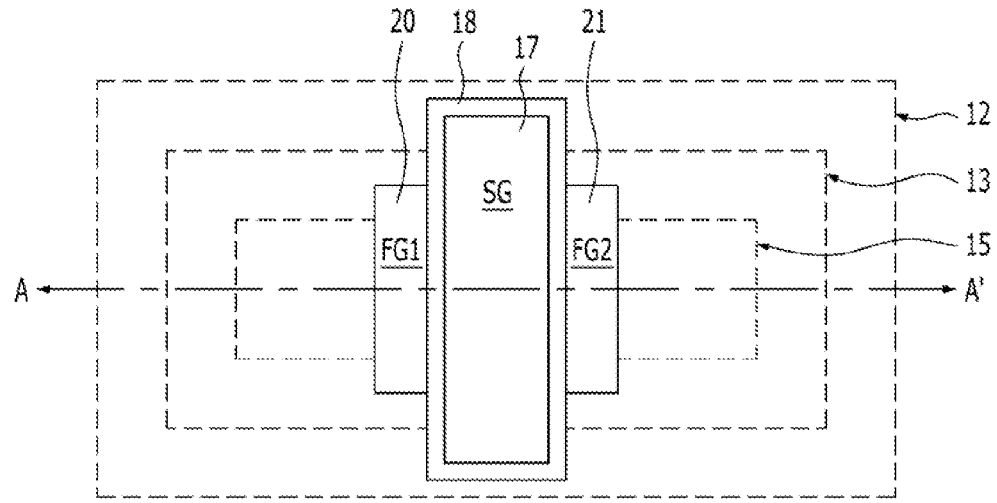
Figure 3E:
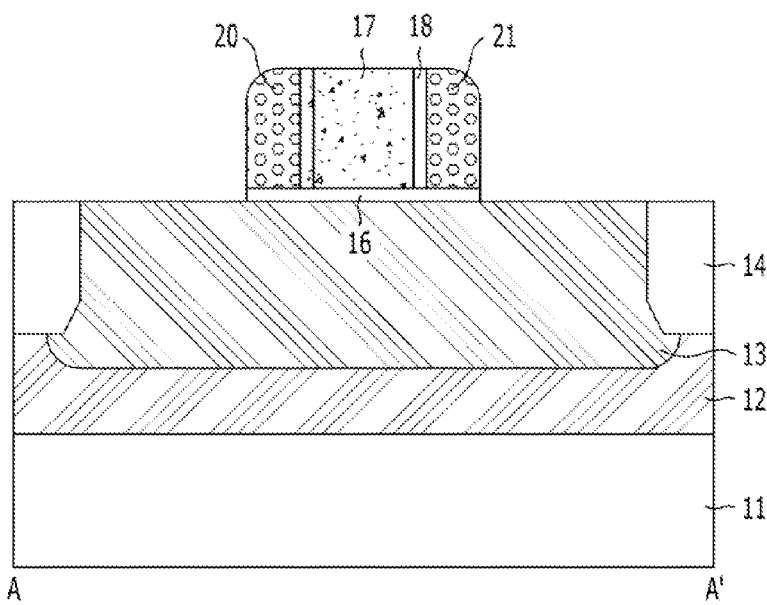

As shown in FIGS. 2E and 3E, a first floating gate FG1 20 is formed on one of the sidewalls of the select gate 17 and a second floating gate FG2 21 is formed on the other of the sidewalls of the select gate 17 at the same time by selectively etching the pre-floating gates 19. The first floating gate 20 and the second floating gate 21 may be formed on the sidewalls of the select gate 17, overlapped with the active region 15, and separated from each other physically and electrically. Accordingly, the first floating gate 20 and the second floating gate 21 may be programmed independently. That is, the first floating gate 20 and the second floating gate 21 may store pieces of logic information independently.

The first floating gate 20 and the second floating gate 21 may be formed by a series of processes of forming a mask pattern (not shown) on a structure including the pre-floating gates 19 and etching the pre-floating gates 19 by using the mask pattern as an etch barrier.

The first floating gate 20 and the second floating gate 21 separated from each other may be formed on the sidewalls of the select gate 17 through the aforementioned processes. Here, if the first floating gate 20 and the second floating gate 21 are formed by a method of forming the pre-floating gates 19 through a blanket-etch process and then performing a patterning process, the first floating gate 20 and the second floating gate 21 may be formed to have the same volume and the same channel length. That is, the first floating gate 20 and the second floating gate 21 may be formed to have the same cell characteristics.

Meanwhile, the first floating gate 20 and the second floating gate 21 may be formed by performing a patterning process on a gate conductive layer without the process of forming the pre-floating gates 19. In this case, however, there is a disadvantage in that uniform cell characteristics may not be secured because it is very difficult to form the first floating gate 20 and the second floating gate 21 so that they have the same volume and the same channel length, due to process factors, such as misalignment.

Figure 2F:
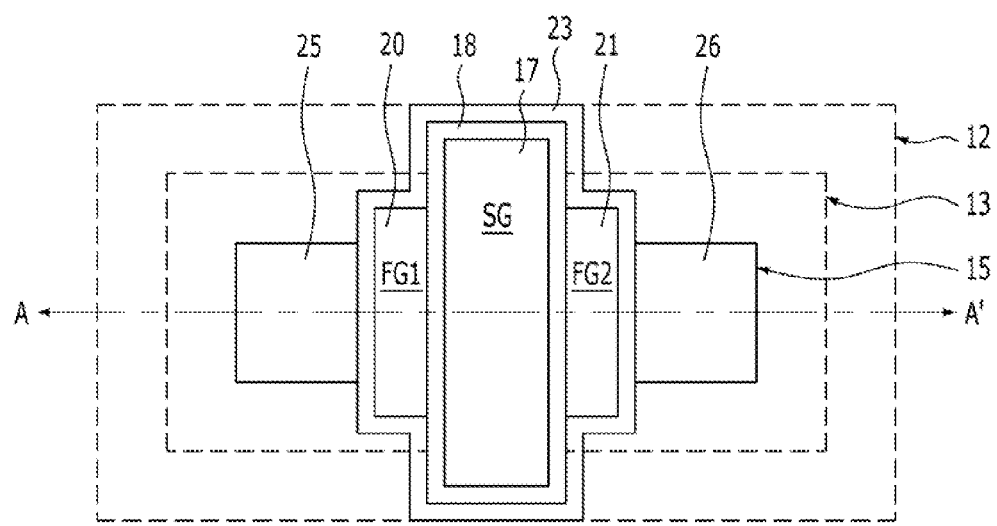
Figure 3F:
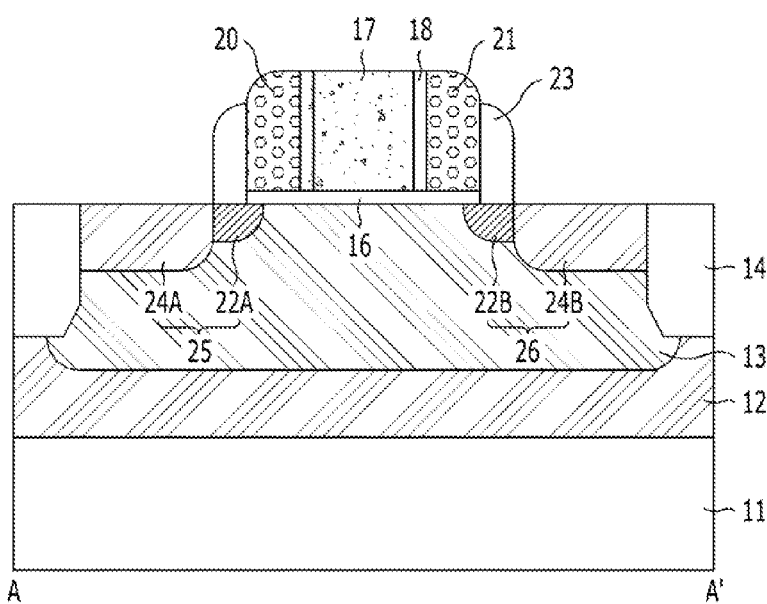

As shown in FIGS. 2F and 3F, first impurity regions 22A and 22B having the second conductive type are formed in the substrate 11 under both sides of a structure, including the select gate 17, the first floating gate 20, and the second floating gate 21. The first impurity regions 22A and 22B may be formed by implanting impurities having the second conductive type into the substrate 11. Also, the first Impurity regions 22A and 22B may be formed to partially overlap with the first floating gate 20 and the second floating gate 21, respectively.

Next, spacers 23 are formed on the sidewalls of the structure, including the select gate 17, the first floating gate 20, and the second floating gate 21. The spacer 23 may be formed of an insulating layer. For example, the spacer 23 may be formed of any one layer selected from the group consisting of an oxide layer, a nitride layer, and an oxide nitride layer, or a stack layer thereof.

Next, second impurity regions 24A and 24B having the second conductive type are formed in the substrate 11 under both sides of a structure, including the select gate 17, the first floating gate 20, the second floating gate 21, and the spacers 23. The second impurity regions 24A and 24B may be formed by implanting impurities having the second conductive type into the substrate 11. The second impurity regions 24A and 24B may be formed to have higher impurity doping concentrations than those of the first impurity regions 22A and 22B, respectively.

Accordingly, a first junction 25 having an LDD structure may be formed in the substrate 11 under the first floating gate 20 and a second junction 26 having an LDD structure may be formed in the substrate 11 under the second floating gate 21.

Since the non-volatile memory device formed by the aforementioned processes includes the select gate 17, an over-erase phenomenon may be prevented and the operating characteristics and the degree of integration of non-volatile memory devices may be improved.

Furthermore, an increase in the area of a unit cell due to the inclusion of the select gate 17 may be offset by forming the first floating gate 20 and the second floating gate 21 that may be programmed independently.

Furthermore, the degree of integration may be improved because the first floating gate 20 and the second floating gate 21 are coupled by the select gate 17 and thus, for example, an additional element for coupling the first floating gate 20 and the second floating gate 21 is not necessary.

Furthermore, cell regularity may be improved because the first floating gate 20 and the second floating gate 21 are formed by performing a blanket-etch process and a patterning process sequentially.

A cell array including a unit cell of the non-volatile memory device in accordance with one embodiment of the present invention is described below. The unit cell is illustrated as being the unit cell of FIGS. 1A and 1B, for convenience of description, and the same reference numerals are used to denote the same elements. Furthermore, a detailed description of the same elements is omitted.

Figure 4A:
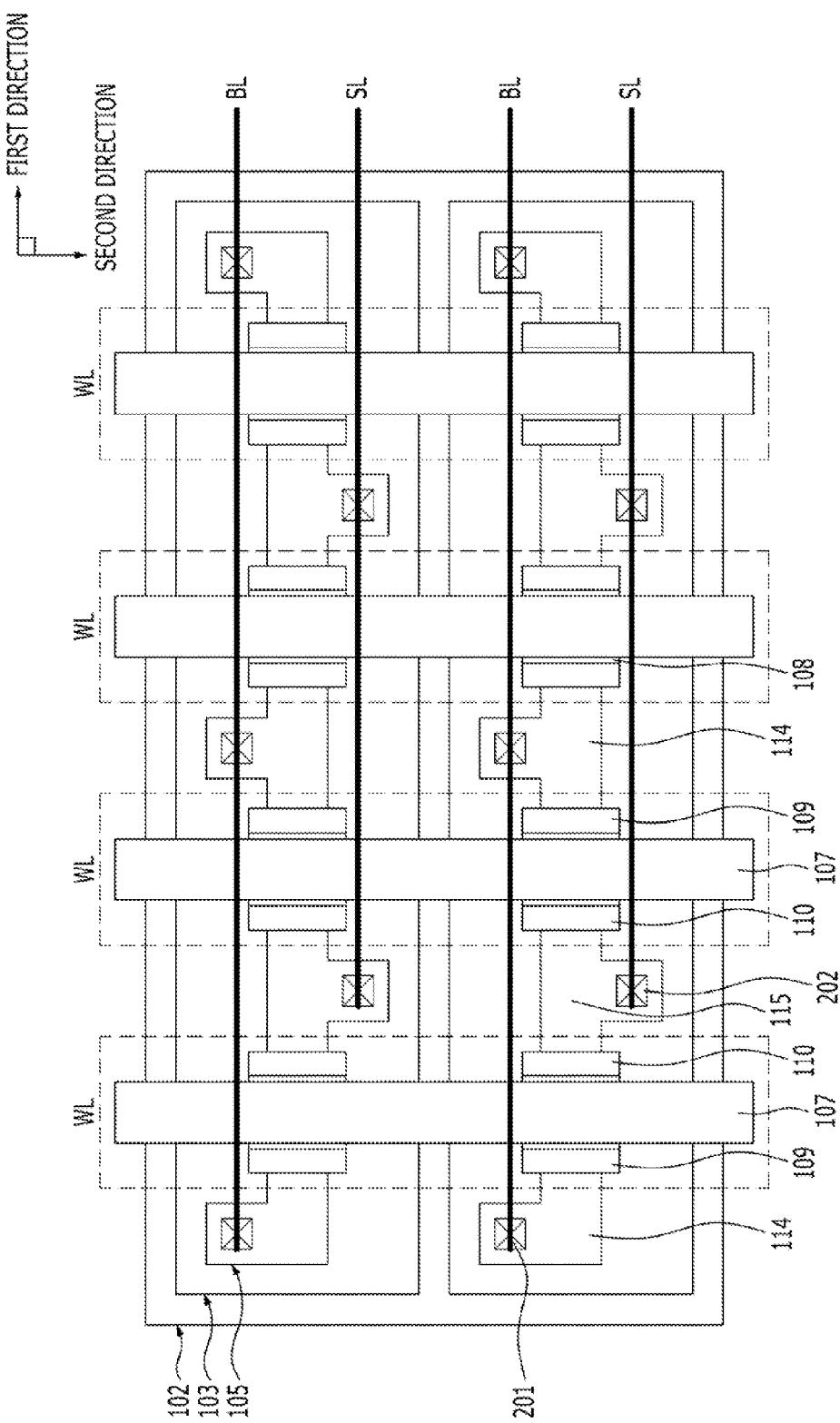

FIG. 4A is a plan view of a cell array of the non-volatile memory device in accordance with one embodiment of the present invention. FIG. 4B is a plan view of a cell array of the non-volatile memory device in accordance with another embodiment of the present invention.

As shown in FIGS. 4A and 4B, the cell array includes a substrate including a plurality of active regions 105, a plurality of word lines WL crossing the active regions 105, junctions 114 and 115 formed in the active regions 105 between the word lines WL, and a bit line BL and a source line SL connected to the respective junctions 114 and 115 on one side and on the other side on the basis of any one word line WL. Here, the word line WL is formed on the sidewalls of each of the select gates 107 so that it overlaps with the active region 105 and the select gate 107 crossing the active region 105, and the word line WL may include a plurality of floating gates 109 and 110 separated from each other so that the floating gates 109 and 110 may be programmed independently.

Referring to FIG. 4A, a second well 102 having the second conductive type is formed in a substrate, and a plurality of first wells 103 having the first conductive type is formed in the second well 102. Each of the first wells 103 may correspond to an active region 105. Each of the first wells 103 may have a line type in which it extends in a first direction, and a plurality of the first wells 103 may be formed within the second well 102 and spaced apart from one another at specific intervals in a second direction. The first wells 103 adjacent to each other in the second direction may be separated from each other by an isolation layer and junction isolation with the second well 102. A bias may be supplied to the second well 102 and the first wells 103 when the non-volatile memory device operates. In such a well structure, a hot carrier injection (HCI) method may be used during a programming operation and the FN tunneling method may used during the erase operation.

Referring to FIG. 4B, the first well 103 having the first conductive type is formed in a substrate. The first well may have a plurality of active regions 105. In such a well structure, the HCI method may be used during the programming operation, and the BTBT method may be used during the erase operation.

The isolation layers that define the active regions 105 are formed in the substrate. The active region 105 may have a line type in which it extends in the first direction, and a plurality of the active regions 105 may be disposed in the second direction and spaced apart from one another at specific intervals. The active region 105 may be disposed in response to the first well 103, and the active region 105 may further include protruding parts that are protruded in the second direction for the purpose of a contact with the bit line BL and the source line SL.

The word line WL may have a line type in which it extends in the second direction, and the word lines WL may be disposed so that they are spaced apart from one another at specific intervals in the first direction. Each of the word lines WL may include one select gate 107 and a plurality of the floating gates 109 and 110, and the number of floating gates 109 and 110 included in the word line WL may be determined by the number of active regions 105 that cross the word line WL. The select gate 107 may have a line type in which it extends in the second direction and crosses a plurality of the active regions 105. A plurality of the select gates 107 may be disposed so that they are spaced apart from one another at specific intervals in the first direction. A plurality of the floating gates 109 and 110 may be disposed on both sidewalls of the select gate 107 in response to the active region 105 so that the floating gates 109 and 110 may be programmed independently. For example, the first floating gate 109 may be disposed on one of the sidewalls of the select gate 107, and the second floating gate 110 may be disposed on the other of the sidewalls of the select gate 107.

The select gate 107 prevents an over-erase phenomenon and also functions as a control gate. That is, a plurality of the floating gates 109 and 110 formed on the sidewalls of the select gate 107 may be coupled at the same time in response to a bias supplied to the select gate 107. When being seen on the plane, a plurality of the floating gates 109 and 110 may have a bar type in which both ends thereof are extended upwardly from the isolation layer in the direction of the short axis of the active region 105. When being seen in the cross section, a plurality of the floating gates 109 and 110 may have a spacer type.

Charge block layers 108 are inserted between the select gate 107 and the plurality of floating gates 109 and 110. More particularly, when being seen on the plane, the charge block layers 108 may have a type in which they are formed on the sidewalls of the select gate 107 and surround the select gate 107 or a type in which they are inserted only between the select gate 107 and the plurality of floating gates 109 and 110. When being seen in the cross section, the charge block layers 108 may have a type in which they are inserted between sidewalls where the select gate 107 face a plurality of the floating gates 109 and 110. The charge block layers 108 may include any one layer selected from the group consisting of an oxide layer, a nitride layer, and an oxide nitride layer, or a stack layer thereof. For example, the charge block layers 108 may be an oxide-nitride-oxide (ONO) layer.

The first junction 114 is formed in the active region 105 on one side on the basis of any one word line WL, and the second junction 115 is formed in the active region 105 on the other side on the basis of the any one word line WL. A bit line contact 201 and a source line contact 202 are formed over the first junction 114 and the second junction 115, respectively. The bit line BL is connected to a plurality of the bit line contacts 201 disposed in the first direction, and the source line SL is connected to a plurality of the source line contacts 202 disposed in the first direction.

The non-volatile memory device having the aforementioned structure may prevent an over-erase phenomenon because it includes the select gates 107. Accordingly, for example, an additional operation, such as recovery, is not necessary, and a peripheral circuit for the recovery operation is not necessary. That is, by preventing the over-erase phenomenon, the operating characteristics and the degree of integration of the non-volatile memory devices may be improved.

Furthermore, since the plurality of floating gates 109 and 110 that may be programmed independently is included, an increase in the area of a unit cell due to the inclusion of the select gate 107 may be offset.

Furthermore, the degree of integration may be improved because the floating gates 109 and 110 are coupled by one select gate 107 and thus, for example, an additional element for coupling the floating gates 109 and 110 is not necessary.

Figure 5A:
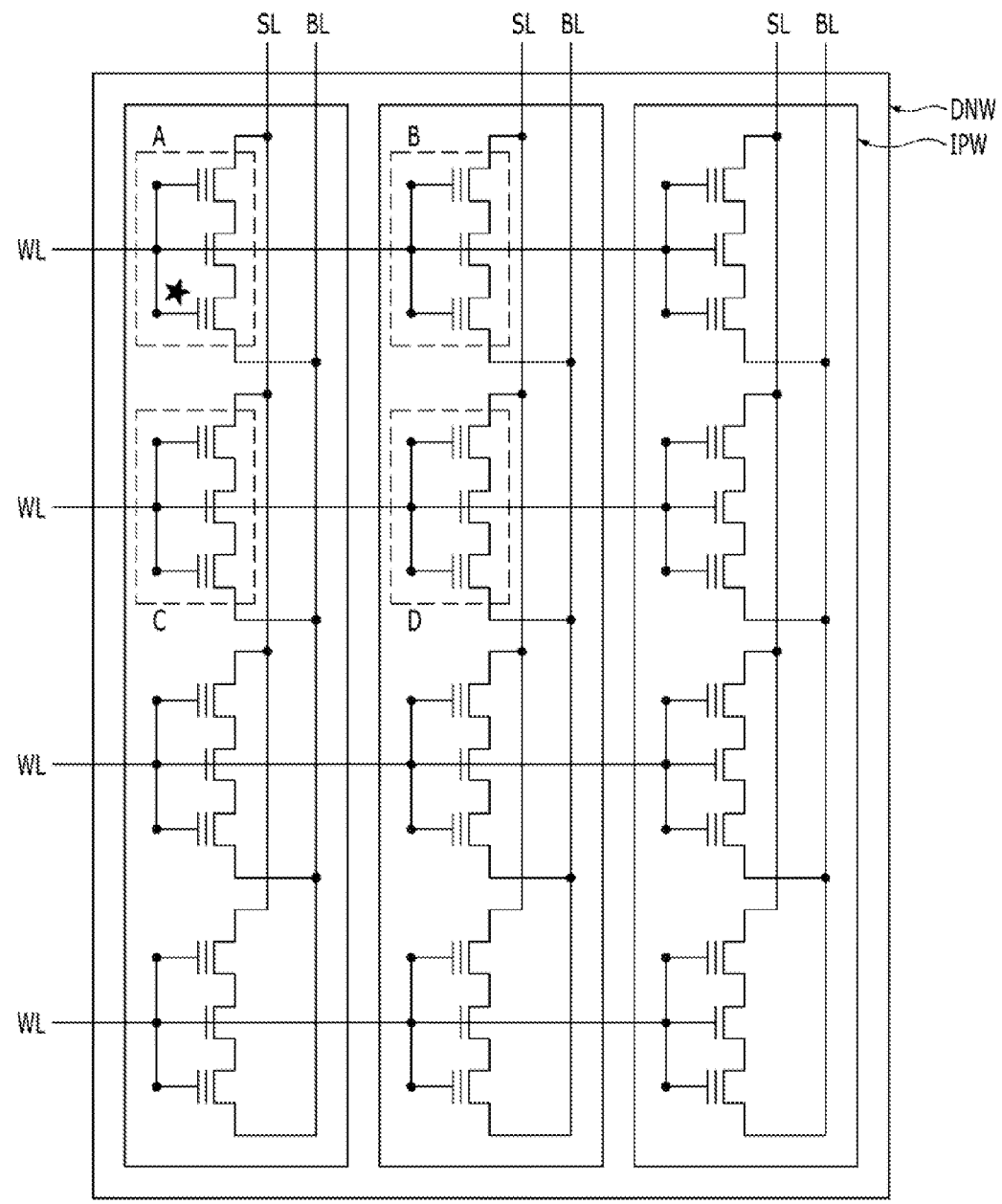
FIGS. 5A and 5B are equivalent circuit diagrams of a non-volatile memory device in accordance with one embodiment of the present invention.
Figure 5B:
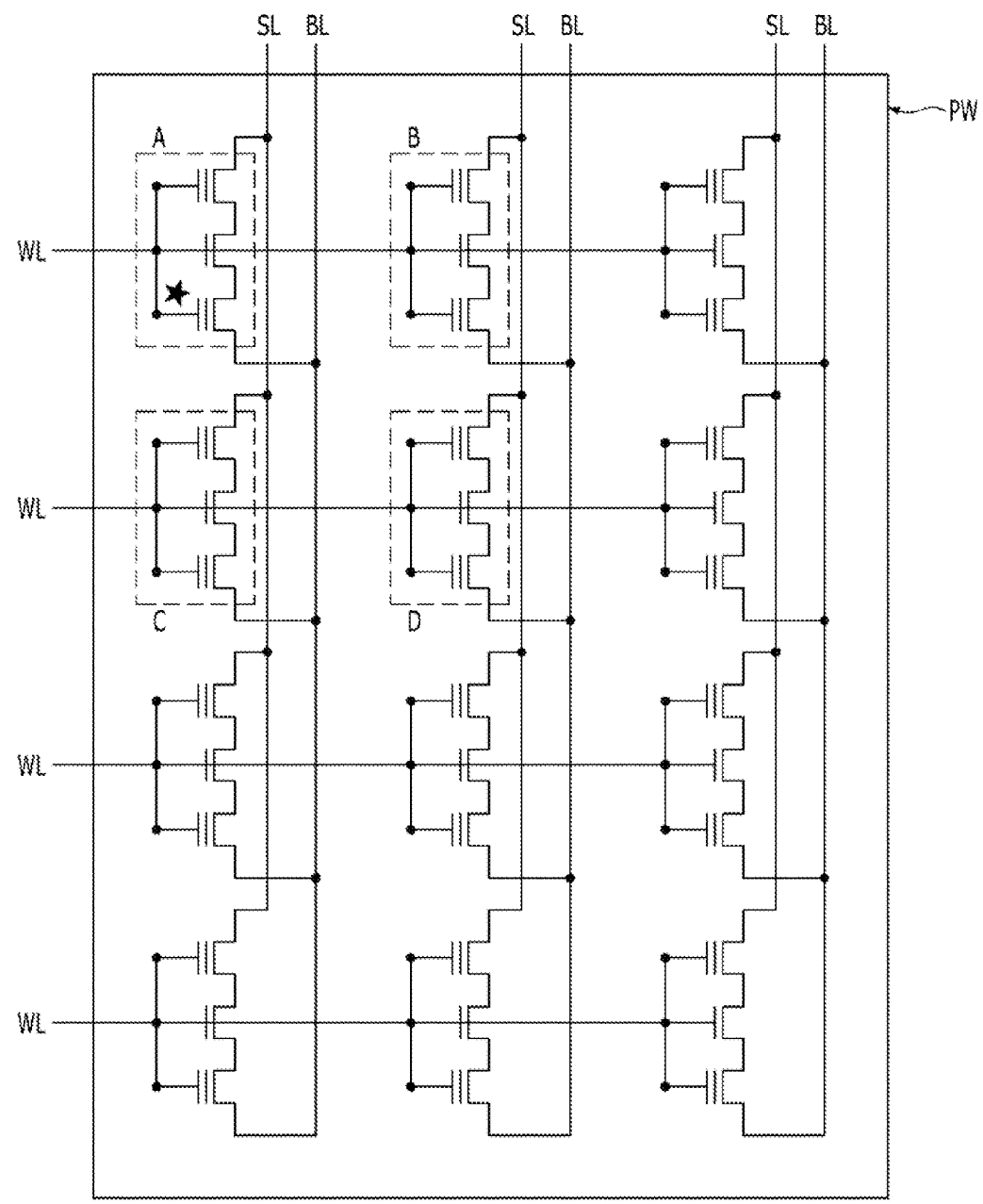

A cell array operation of a non-volatile memory device in accordance with one embodiment of the present invention are described below with reference to FIGS. 5A and 5B, showing an equivalent circuit diagram of the cell array shown in FIGS. 4A and 4B. Table 2 shows an example of the operating conditions (corresponding to FIGS. 4A and 5A) of the cell array of the non-volatile memory device in accordance with one embodiment of the present invention. For reference, in Table 2, an 'IPW' denotes a first well having a conduction type of a P type, and a 'DNW' denotes a second well having a conduction type of an N type. Furthermore, a description is given on the basis of a floating gate (refer to a symbol ' ★ ') formed on one of the sidewalls of the select gate.

TABLE 2

| OPERATION | | PROGRAM | ERASE | READ |
|---|---|---|---|---|
| METHOD | | HCI | FN TUNNEING | FORWARD |
| MINIMUM OPERATIN UNIT | | BIT | PAGE, BYTE, BIT | RANDOM ACCESS |
| SELECTED CELL A | WL | VPP | GND | VCC |
| | SL | GND | FLOATING | Vread |
| | BL | VPP | FLOATING | GND |
| | IPW | GND | VPP | GND |
| | DNW | GND | VPP | VCC |
| NSELECTED CELL B SHARING WL, BUT NOT SHARING BL | WL | VPP | GND | VCC |
| | SL | GND | FLOATING | GND |
| | BL | GND | FLOATING | GND |
| | IPW | GND | GND | GND |
| | DNW | GND | GND | GND |
| UNSELECTED CELL C SHARING BL, BUT NOT SHARING WL | WL | GND | ½VPP | GND |
| | SL | GND | FLOATING | GND |
| | BL | VPP | FLOATING | Vread |
| | IPW | GND | VPP | GND |
| | DNW | GND | VPP | GND |
| UNSELECTED CELL D | WL | GND | ½VPP | GND |
| | SL | GND | FLOATING | GND |
| | BL | GND | FLOATING | GND |
| | IPW | GND | GND | GND |
| | DNW | GND | GND | GND |

First, a program operation may be performed in accordance with a hot carrier injection (HC) method and may be performed for every bit. More particularly, in the state where a plurality of floating gates formed on the sidewalls of a select gate has been floated by supplying a first selection voltage, for example, a pumping voltage VPP to a word line WL, that is, the select gate of a selected cell A, the floating gate formed on one of the sidewalls of the selected cell A may be programmed by supplying a program voltage, for example, the pumping voltage VPP to a bit line BL connected to the selected cell A.

When the program operation is performed, an unselected cell B that shares the word line WL connected to the selected cell A is not programmed because a ground voltage GND is supplied to a source line SL and the bit line BL connected to the unselected cell B. Furthermore, an unselected cell C that shares the bit line BL connected to the selected cell A is not programmed because the ground voltage GND is supplied to a word line WL connected to the unselected cell C.

Next, an erase operation may be performed in accordance with a FN tunneling method and may be performed for each page, for each byte, or for each bit. The erase unit may be selected by controlling an arrangement relation between an first well IPW, a second well DNW, and the word lines WL and the conditions of a bias supplied to First well IPW, the second well DNW and the word line WL.

An erase operation on the selected cell A may be performed by supplying an erase voltage, for example, the pumping voltage VPP or a minus pumping voltage –VPP to the first well IPW of the selected cell A in the state where the ground voltage GND has been supplied to the word line WL connected to the selected cell A and the source line SL and the bit line BL connected to the selected cell A have been floated.

When the erase operation is performed, the unselected cell B that shares the word line WL connected to the selected cell A, but does not share the bit line BL connected to the selected cell A, is not erased because the ground voltage GND is supplied to the first well IPW of the unselected cell B. Furthermore, the unselected cell C that shares the bit line BL connected to the selected cell A, but does not share the word line WL connected to the selected cell A, is not erased because an erase prevention voltage (e.g., ½VPP or –½VPP) is supplied to the unselected cell C.

Next, a read operation may be performed in accordance with a forward read method in which a read operation is performed by way of the migration of electric charges in the same direction as the direction in which charges are moved when a program operation is performed. The read operation may be performed by sensing a shift in the threshold voltage of a unit cell. In this case, a shift in the threshold voltage of each floating gate may be sensed or a shift in the threshold voltages of floating gates within a unit cell may be sensed at the same time.

The selected cell A may be read in such a way as to supply the power source voltage VCC and the read voltage Vread to the word line WL and the bit line BL connected to the selected cell A. The power source voltage VCC may be voltage between the threshold voltage of a programmed cell and the threshold voltage of an erased cell, and the read voltage Vread may be higher than the ground voltage GND, but lower than the power source voltage VCC.

When the read operation is performed, the unselected cell B that shares the word line WL connected to the selected cell A may not be read because the ground voltage GND is supplied to the source line SL and the bit line BL connected to the unselected cell B. Furthermore, the unselected cell C that shares the bit line BL connected to the selected cell A may not be read because the ground voltage GND is supplied to the word line WL connected to the unselected cell C.

Subsequently, table 3 shows an example of the operating conditions (corresponding to FIGS. 4B and 5B) of a cell array of a non-volatile memory device in accordance with one embodiment of the present invention. For reference, in Table 3, an 'IPW' denotes a first well having a conduction type of a P type, and a 'DNW' denotes a second well having a conduction type of an N type. Furthermore, a description is given on the basis of a floating gate (refer to a symbol '★') formed on one of the sidewalls of the select gate.

TABLE 3

| OPERATION | | PROGRAM | ERASE | READ |
|---|---|---|---|---|
| METHOD | | HCI | FN TUNNEING | FORWARD |
| MINIMUM OPERATIN UNIT | | BIT | PAGE, BYTE, BIT | RANDOM ACCESS |
| SELECTED CELL A | WL | VPP | –VPP | VCC |
| | SL | GND | FLOATING | GND |
| | BL | VPP | VPP | Vread |
| | PW | GND | GND | GND |
| UNSELECTED CELL B SHARING WL, BUT NOT SHARING BL | WL | VPP | –VPP | VCC |
| | SL | GND | FLOATING | GND |
| | BL | GND | FLOATING | GND |
| | PW | GND | GND | GND |
| UNSELECTED CELL C SHARING BL, BUT NOT SHARING WL | WL | GND | GND | GND |
| | SL | GND | FLOATING | GND |
| | BL | VPP | VPP | Vread |
| | PW | GND | GND | GND |
| UNSELECTED CELL D | WL | GND | ½VPP | GND |
| | SL | GND | FLOATING | GND |
| | BL | GND | FLOATING | GND |
| | PW | GND | GND | GND |

First, a program operation may be performed in accordance with the HCI method. A read operation may be performed in accordance with a forward read method in which a read operation is performed by way of the migration of electric charges in the same direction as the direction in which charges are moved when a program operation is performed. Since the program operation and the read operation in accordance with the table 3 are same as the program operation and the read operation in accordance with the table 2, detailed descriptions of the program operation and the read operation in accordance with the table 3 is omitted.

Due to difference of a well structure formed in a substrate, an erase operation may be performed in accordance with a BTBT method and may be performed for each page, for each byte, or for each bit, which may be determined by adjusting a bias condition which is supplied to a word line WL, a source line SL and a bit line BL.

The erase operation for a selected cell A may be performed by supplying a first erase voltage (e.g., a negative pumping voltage –VPP) to the word line of the selected cell A, and supplying a second erase voltage (e.g., a pumping voltage VPP) to the bit line BL in state in which the source line SL is floating. A ground voltage GND may be supplied to the first well PW.

The erase operation for an unselected cell B sharing the word line WL but not sharing the bit line BL is not performed since the source line SL and the bit line BL are floating. The erase operation for an unselected cell C sharing the bit line BL but not sharing the word line WL is not performed since the ground voltage GND is supplied to the word line WL.

Figure 6:
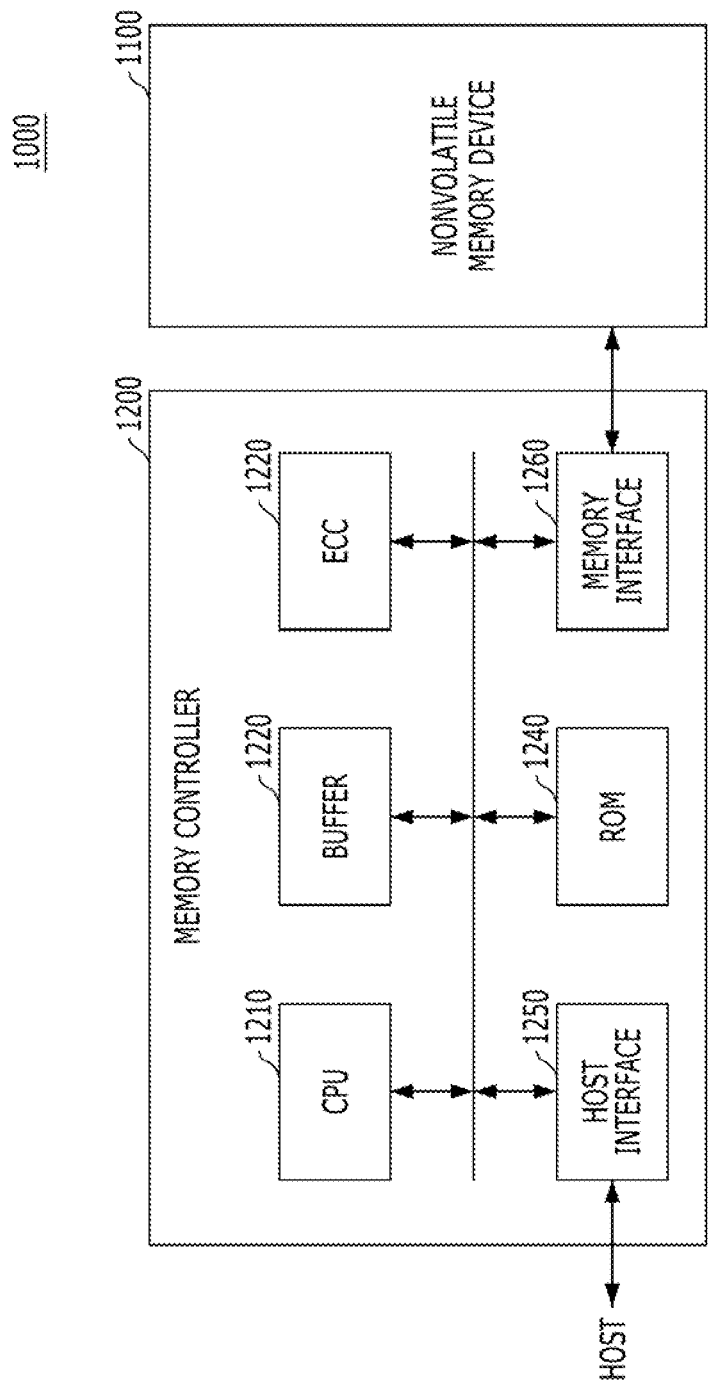
FIG. 6 is a block diagram of a memory system including a non-volatile memory device in accordance with one embodiment of the present invention.

FIG. 6 is a block diagram of a memory system including a non-volatile memory device in accordance with one embodiment of the present invention.

As shown in FIG. 6, the memory system 1000 may include a non-volatile memory device 1100 and memory controller 1200 for controlling the exchange of data between a host HOST and the non-volatile memory device 1100. The non-volatile memory device 1100 is implemented so that it includes the unit cell, operating method, and cell array of the non-volatile memory device in accordance with one embodiment of the present invention. The memory controller 1200 may include a CPU 1210, a buffer 1220, an ECC circuit 1230, ROM 1240, a host interface 1250, and a memory interface 1260.

The aforementioned memory system 1000 may be provided in the form of a personal digital assistant (PDA), a portable computer, a web tablet, a wireless phone, a mobile phone, a digital music player, a memory card, wherein all electronic products may transmit and/or receive information in a wireless environment, a solid state disk, a camera image sensor, and other application chipsets.

The non-volatile memory device in accordance with one embodiment of the present invention and an application device including the same may be mounted in the form of various packages. For example, the non-volatile memory device and an application device including the same may be packaged and mounted in the form of a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a small outline SOIC, a shrink small outline package (SSOP), a thin small outline package (TSOP), a thin quad flat package (TQFP), a system in package (SIP), a multi-chip package (MCP), a wafer-level fabricated package (WFP), a wafer-level processed stack package (WSP), and wafer-level chip scale packages (WLCSPs).

This technology based on the aforementioned object may prevent an over-erase phenomenon because it includes the select gate and may also improve operating characteristics and the degree of integration because it does not require an additional operation for preventing an over-erase phenomenon and a peripheral circuit for the additional operation.

Furthermore, this technology may offset an increase in the area of a unit cell due to the inclusion of the select gate because a plurality of floating gates sharing the select gate may be programmed independently.

Furthermore, this technology may improve the degree of integration more effectively because a plurality of the floating gates is coupled by the select gate and thus an additional element for coupling the plurality of floating gates is not necessary.

Furthermore, this technology may improve cell uniformity because a plurality of floating gates is formed by performing a blanket-etch process and a patterning process sequentially.

While the present invention has been described with respect to the specific embodiments, it will be apparent to those skilled in the art that various changes and modifications may be made without departing from the spirit and scope of the invention as defined in the following claims.

What is claimed is:

1. A non-volatile memory device, comprising:
   a select gate formed over a substrate;
   a plurality of floating gates laterally formed with respect to the select gate and spaced apart from each other, to be independently programmable, wherein each of the plurality of floating gates is laterally coupled to the select gate; and
   a plurality of junctions formed in the substrate and arranged to be controllable by the respective floating gates,
   wherein a floating gate adjacent to any one of the plurality of junctions, from among the plurality of floating gates, is programmed in response to only a bias supplied to the select gate and a bias supplied to the any one junction.

2. The non-volatile memory device of claim 1, further comprising charge block layers formed between the select gate and the plurality of floating gates.

3. The non-volatile memory device of claim 1, further comprising:
   a second well formed in the substrate; and
   a first well formed in the second well and having a conduction type complementary to the second well,
   wherein the plurality of floating gates overlaps with the second well and the first well.

4. The non-volatile memory device of claim 3, wherein the plurality of floating gates is erased in response to a bias supplied to the second well, or a bias supplied to the first well, or a bias supplied to the second well and a bias supplied to the first well.

5. The non-volatile memory device of claim 1, wherein the plurality of floating gates has a spacer type.

6. The non-volatile memory device of claim 1, wherein the plurality of floating gates is simultaneously coupled in response to a bias supplied to the select gate.

7. A non-volatile memory device, comprising:
   a select gate formed over a substrate;
   a first floating gate formed on one of sidewalls of the select gate;
   a second floating gate formed on the other of the sidewalls of the select gate;
   a first junction formed in the substrate under the first floating gate; and
   a second junction formed in the substrate under the second floating gate,
   wherein the first floating gate and the second floating gate are independently programmable,
   wherein each of the first floating gate and the second floating gate is coupled to the select gate,
   wherein the first floating gate is programmed in response to only a bias supplied to the select gate and a bias supplied to the first junction, and
   wherein the second floating gate is programmed in response to only a bias supplied to the select gate and a bias supplied to the second junction.

8. The non-volatile memory device of claim 7, further comprising charge block layers formed between the select gate and the first floating gate and between the select gate and the second floating gate, respectively.

9. The non-volatile memory device of claim 7, further comprising:
   a second well formed in the substrate; and
   a first well formed in the second well and having a conduction type complementary to the second well,
   wherein the first floating gate and the second floating gate overlap with the second well and the first well, respectively.

10. The non-volatile memory device of claim 9, wherein the first floating gate and the second floating gate are erased in response to a bias supplied to the second well, or a bias supplied to the first well, or both a bias supplied to the second well and a bias supplied to the first well.

11. The non-volatile memory device of claim 7, wherein the first floating gate and the second floating gate have a spacer type.

12. The non-volatile memory device of claim 7, wherein the first floating gate and the second floating gate are simultaneously coupled in response to a bias supplied to the select gate.

13. A non-volatile memory device, comprising:
    a substrate including a plurality of active regions;
    a plurality of word lines crossing the active regions;

a plurality of junctions formed in the active region between the word lines; and a bit line and a source line connected to the respective junctions on one side and the other side of any one of the word lines, wherein the word line comprises a select gate crossing the active region and a plurality of floating gates formed on sidewalls of the select gate in such a way as to overlap with the active region and spaced apart from each other in such a way as to be independently programmed, wherein any one of the plurality of floating gates is programmed in response to only a bias supplied to the bit line and a bias supplied to the select gate, or only a bias supplied to the source line and a bias supplied to the select gate, and wherein each of the plurality of floating gates is coupled to the select gate.

14. The non-volatile memory device of claim 13, further comprising charge block layers formed between the select gate and the plurality of floating gates.

15. The non-volatile memory device of claim 13, further comprising:

a second well formed in the substrate and including the plurality of active regions; and a plurality of first wells formed in the second well in response to the plurality of active regions.

16. The non-volatile memory device of claim 15, wherein the plurality of floating gates is erased in response to a bias supplied to the select gate and a bias supplied to the second well, or a bias supplied to the select gate and a bias supplied to the first well, or a bias supplied to the select gate and both a bias supplied to the second well and a bias supplied to the first well.

17. The non-volatile memory device of claim 13, wherein the plurality of floating gates has a spacer type.

18. The non-volatile memory device of claim 13, wherein the plurality of floating gate formed on the sidewalls of the select gate is simultaneously coupled in response to a bias supplied to the select gate.

* * * * *